United States Patent

Sadowski

Patent Number: 5,945,854
Date of Patent: Aug. 31, 1999

[54] PHASE LOCKED LOOPS INCLUDING INPUT AMPLITUDE CONTROL

[75] Inventor: Bogdan Sadowski, Apex, N.C.

[73] Assignee: Ericsson Inc., Research Triangle Park, N.C.

[21] Appl. No.: 09/023,667

[22] Filed: Feb. 10, 1998

[51] Int. Cl.[6] ................................................. H03B 3/04
[52] U.S. Cl. ........................ 327/156; 327/159; 327/158; 327/162; 331/2; 331/18; 331/25
[58] Field of Search .................................. 327/156, 5, 3, 327/7, 155, 157, 158, 159, 161, 141; 331/2, 18, 25, 182, 15, 65, 11; 329/360, 325; 371/47.1

[56] References Cited

U.S. PATENT DOCUMENTS

| | | | |
|---|---|---|---|
| 3,949,314 | 4/1976 | Machida | 329/346 |
| 4,135,164 | 1/1979 | Kurata | 331/2 |
| 4,166,979 | 9/1979 | Waggener | 375/376 |
| 4,513,249 | 4/1985 | Baghdady | 327/356 |
| 4,841,256 | 6/1989 | Gastgeb | 331/25 |
| 4,954,788 | 9/1990 | Leis et al. | 331/16 |
| 5,017,841 | 5/1991 | Miura | 329/325 |
| 5,202,924 | 4/1993 | Richards, Jr. | 381/13 |
| 5,408,202 | 4/1995 | Shirazi et al. | 331/8 |
| 5,631,601 | 5/1997 | Horsfall et al. | 329/325 |
| 5,642,082 | 6/1997 | Jefferson | 331/25 |

FOREIGN PATENT DOCUMENTS

| | | |
|---|---|---|
| 2693277 A1 | 11/1977 | France . |
| 3544622 | 6/1987 | Germany . |
| WO 97/29439 | 8/1997 | WIPO . |

*Primary Examiner*—Timothy P. Callahan
*Assistant Examiner*—April Giles
*Attorney, Agent, or Firm*—Myers Bigel Sibley & Sajovec

[57] ABSTRACT

Phase locked loops include a controlled oscillator that is responsive to a control signal, to generate an output signal, the frequency of which is a function of the control signal. A phase detector is responsive to a reference frequency input signal and to the output signal, to produce an error signal. A loop filter filters the error signal, to thereby produce the control signal. A bandpass filter is responsive to the error signal, to produce a filtered error signal at twice the frequency of the reference frequency, and an envelope detector is responsive to the filtered error signal to sense the amplitude of the filtered error signal. A variable attenuation circuit is responsive to the envelope detector output, to variably attenuate a phase locked loop input signal based on the amplitude of the filtered error signal, and thereby produce the reference frequency input signal.

13 Claims, 4 Drawing Sheets

PHASE LOCKED LOOPS INCLUDING INPUT AMPLITUDE CONTROL

FIELD OF THE INVENTION

This invention relates to electronic circuits, and more particularly to phase locked loops.

BACKGROUND OF THE INVENTION

Phase locked loops are widely used in electronic systems. For example, phase locked loops are widely used in communication systems including but not limited to radio frequency communications systems such as radiotelephones. FIG. 1 is a block diagram illustrating a conventional phase locked loop.

Referring now to FIG. 1, a conventional phase locked loop 100 includes a controlled oscillator 102 such as a voltage controlled oscillator (VCO) that is responsive to a control signal 104, to generate an output signal 106, the frequency of which is a function of the control signal. A sinusoidal phase detector 108, also referred to as a multiplier, is responsive to a reference frequency input signal 112 and to the output signal 106 to produce an error signal 114. A loop filter 116 filters the error signal 114, to thereby produce the control signal 104 that is provided to the voltage controlled oscillator 102. The loop filter is designed to provide stability of the phase locked loop. The phase locked loop may also be responsive to an offset frequency signal 118 using a frequency converter 120 that is responsive to the output signal 106 and to the offset frequency signal 118. The output of the frequency converter may be filtered by a bandpass filter 122. When an offset frequency is used, the phase detector 108 is responsive to the output signal 106', the frequency of which is offset from the frequency of the VCO output signal 106 by the frequency of the offset frequency signal 118. The design and operation of the phase locked loop 100 and the individual components thereof are well known to those having skill in the art and need not be described further herein.

As the performance of electronic systems continue to improve, it is desirable to obtain improved performance from the phase locked loop. As is well known to those having skill in the art, since the phase detector works in a linear region, amplitude fluctuations at the inputs thereof can produce phase detector gain variation and consequently phase locked loop bandwidth variations, and may result in undesired modulation of the voltage controlled oscillator 102. Accordingly, it is important to control the amplitude of the reference frequency input signal 112 that is provided to the sinusoidal phase detector 108.

One conventional technique to control the amplitude of the reference frequency input signal 112 is to include an automatic gain control circuit that is responsive to a phase locked loop input signal, to thereby generate a reference frequency input signal having a controlled amplitude. Unfortunately, the use of a separate automatic gain control circuit may unduly increase the complexity of the phase locked loop.

Another conventional technique is to place a gain control circuit within the phase locked loop, to thereby control the amplitude of the control signal 104 or of the error signal 114. Such a gain control within the loop may include a variable gain circuit. Unfortunately, the addition of an automatic gain control circuit within the phase locked loop may unduly degrade the noise performance and/or complexity of the phase locked loop.

SUMMARY OF THE INVENTION

It is therefore an object of the present invention to provide improved phase locked loop circuits and methods of operating the same.

It is another object of the present invention to provide phase locked loop circuits and operating methods that can reduce the impact of amplitude variations in a reference frequency input signal.

It is still another object of the present invention to provide phase locked loop circuits that can control the amplitude of a reference frequency input signal without unduly complicating or degrading the performance of the phase locked loop. These and other objects are provided, according to the present invention, by providing an amplitude control circuit that is responsive to the error signal of a phase locked loop, to variably attenuate a phase locked loop input signal and produce a constant amplitude reference frequency input signal. The amplitude control circuit provides means for controlling the amplitude of the phase locked loop input signal in response to the error signal, to produce the reference frequency input signal preferably having constant amplitude. Since the amplitude control circuit controls the amplitude of the phase locked loop input signal rather than amplitude of the control or error signals, the influence of 1/f noise generated in the amplitude control circuit, on noise performance of the phase locked loop may be reduced, due to the fact that the phase locked loop input signal has much higher frequency than the control signal or the error signal. Moreover, since the amplitude control circuit is responsive to the error signal and provides control of the amplitude of the phase locked loop input signal, a separate automatic gain control circuit, and the attendant complexity, need not be provided.

More specifically, phase locked loops according to the invention include a controlled oscillator that is responsive to a control signal, to generate an output signal the frequency of which is a function of the control signal. A phase detector is responsive to a reference frequency input signal and to the output signal, to produce an error signal. A loop filter filters the error signal, to thereby produce the control signal. The loop filter is designed to provide phase locked loop stability. A variable attenuation circuit is responsive to the error signal, to variably attenuate a phase locked loop input signal to produce the reference frequency input signal preferably having constant amplitude.

Phase locked loops according to the present invention may also include a bandpass filter that is responsive to the error signal, to produce a filtered error signal, and an envelope detector that is responsive to the filtered error signal to detect the amplitude thereof. The variable attenuation circuit is responsive to the amplitude control signal produced by the envelope detector, to variably attenuate the phase locked loop input signal based on the detected amplitude of the filtered error signal.

The bandpass filter is centered at about twice the reference frequency. Accordingly, the invention recognizes that the sinusoidal phase detector or multiplier produces an error signal having components at twice the reference frequency. The components at twice the reference frequency are generally filtered by the loop filter. However, the present invention uses these components at twice the reference frequency, in order to detect the amplitude of the phase locked loop input signal, and thereby control the amplitude thereof using a variable attenuation circuit.

The variable attenuation circuit is preferably a linear variable attenuator. However, other variable attenuation circuits having monotonic function of attenuation versus control may also be used. The variable attenuator may include a resonant tank notch circuit. However, other conventional variable attenuators may also be used.

Methods of controlling a phase locked loop according to the present invention comprise the step of controlling amplitude of a phase locked loop input signal in response to the error signal, to produce the reference frequency input signal. The amplitude is preferably controlled by variably attenuating the phase locked loop input signal in response to the error signal, to produce the reference frequency input signal preferably having constant amplitude. The amplitude is controlled by bandpass filtering the error signal to produce a filtered error signal and sensing the amplitude of the filtered error signal. The variable attenuation is performed by variably attenuating the phase locked loop input signal in response to the level of the amplitude of filtered error signal, to produce a reference frequency input signal. Sensing may take place by envelope detecting the amplitude of the filtered error signal. Accordingly, high performance phase locked loops may be provided without unduly complicating the phase locked loop and without introducing potential 1/f noise sources into the phase locked loop.

DETAILED DESCRIPTION OF PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
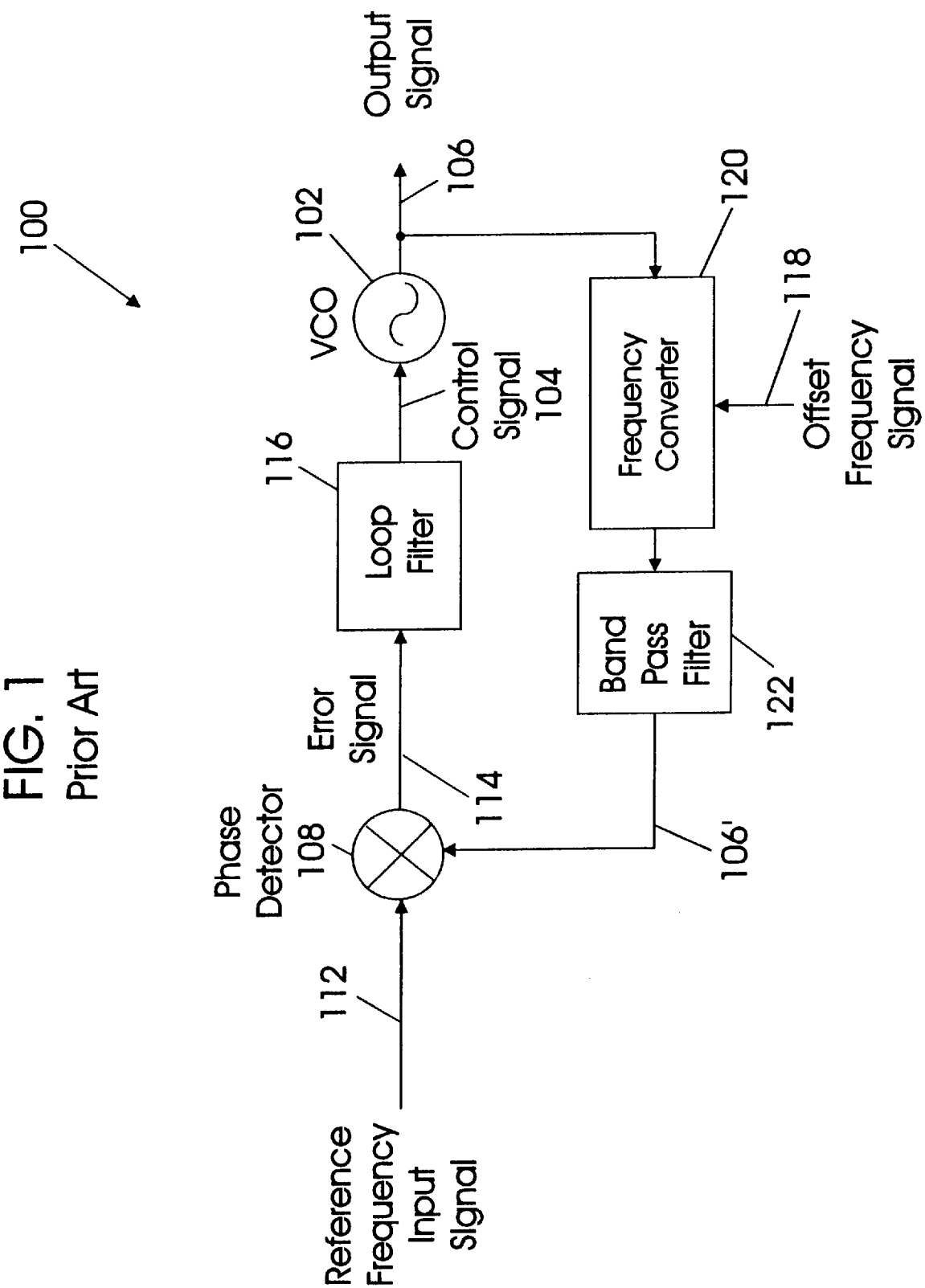
FIG. 1 is a block diagram of conventional phase locked loops.
Figure 2:
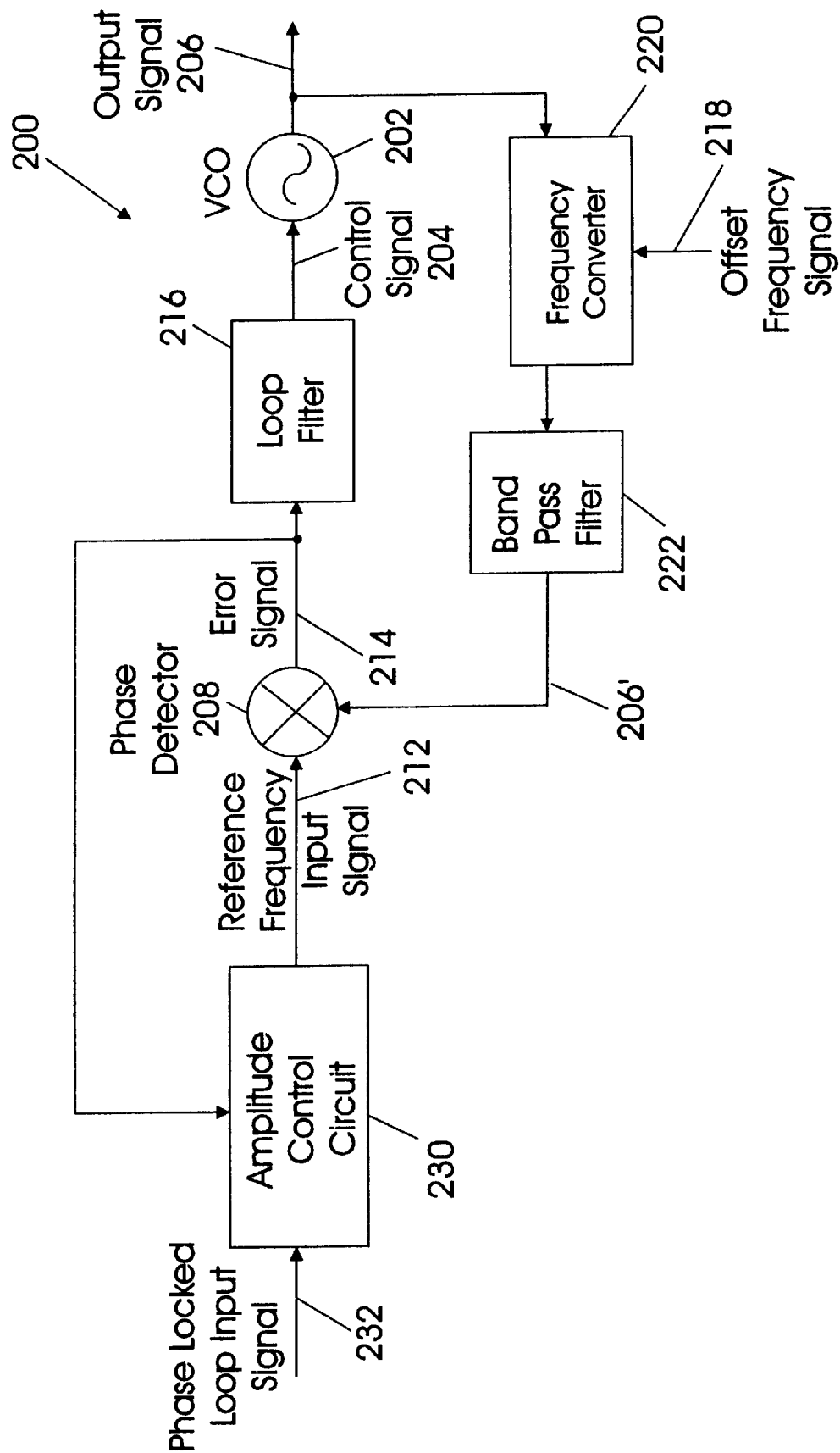
FIG. 2 is a block diagram of phase locked loops according to the present invention.

Referring now to FIG. 2, a block diagram of phase locked loops according to the present invention will now be described. Phase locked loops 200 according to the invention include a controlled oscillator 202 such as a voltage controlled oscillator (VCO) that is responsive to a control signal 204, to generate an output signal 206 the frequency of which is a function of control signal 204. A sinusoidal phase detector 208, also referred to as a multiplier, is responsive to a reference frequency input signal 212 and to the output signal 206 to produce an error signal 214. A loop filter 216 filters the error signal 214, to thereby produce the control signal 204 that is provided to the voltage controlled oscillator 202. Loop filter is designed to provide phase locked loop stability. The phase locked loop may also be responsive to an offset frequency signal 218 using frequency converter 220 that is responsive to the output signal 206 and to the offset frequency signal. The output of the frequency converter may be filtered by a bandpass filter 222. When an offset frequency is used, the phase detector 208 is responsive to the signal indicated by 206' in FIG. 2, the frequency of which is offset from the frequency of the output signal 206 by the frequency of the offset frequency signal 218. The design and operation of phase locked loop 200, as described above, and the individual components described above, are well known to those having skill in the art and need not be described further herein.

Still referring to FIG. 2, phase locked loops 200 according to the present invention include an amplitude control circuit 230 that controls the amplitude of a phase locked loop input signal 232 in response to the error signal 214, to produce the reference frequency input signal 212. Accordingly, the amplitude control circuit 230 provides negative feedback around the phase detector 208, to stabilize the amplitude of the reference frequency input signal and consequently the phase detector gain. The introduction of additional components within the phase locked loop is not required and an external automatic gain control circuit is not required.

Figure 3:
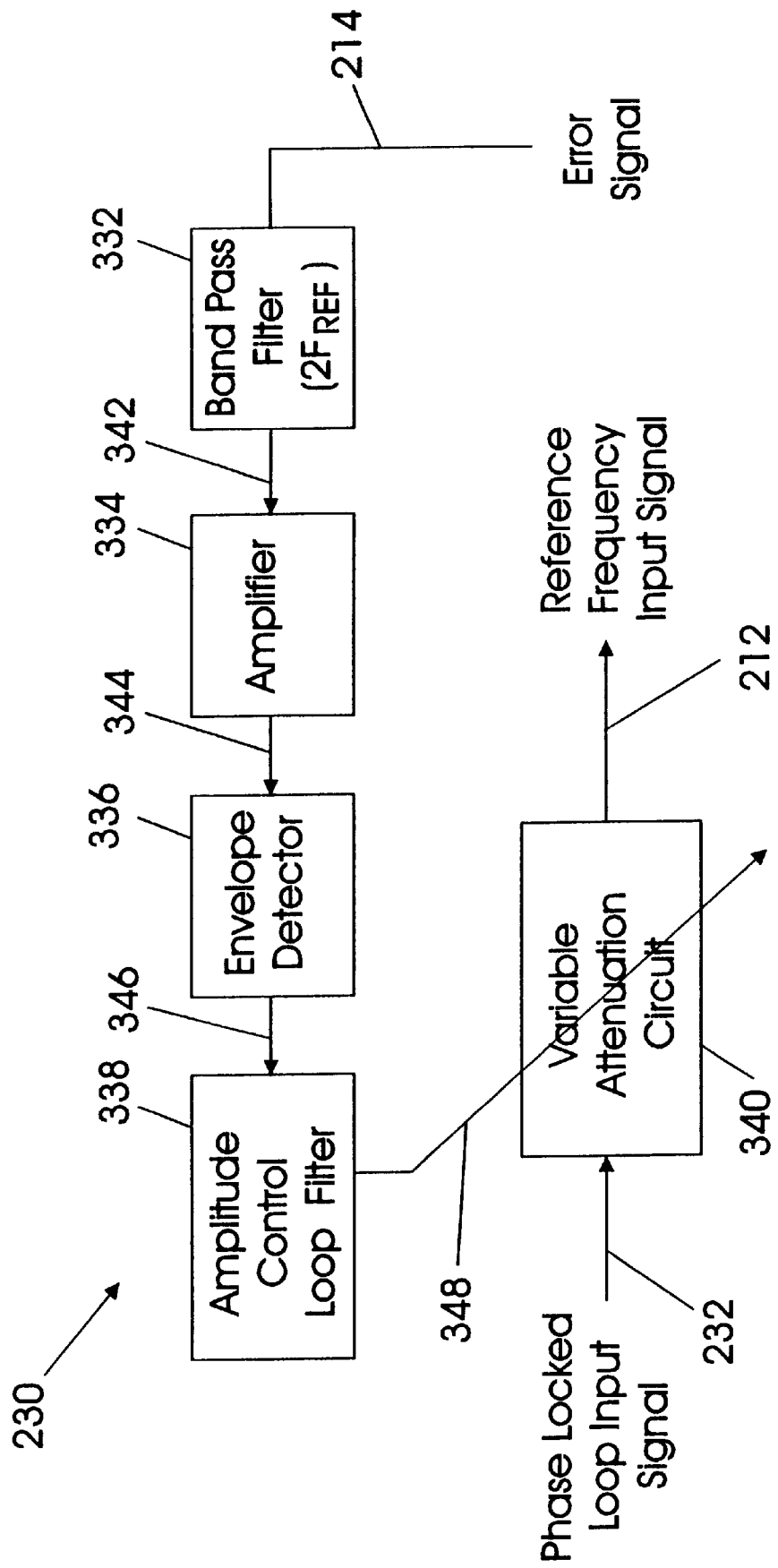
FIG. 3 is a block diagram of amplitude control circuits and methods of FIG. 2.

FIG. 3 is a block diagram of a preferred embodiment of amplitude control circuit 230. As shown in FIG. 3, amplitude control circuit 230 utilizes a variable attenuation circuit 340 that is responsive to the amplitude of a component of the error signal 214 at twice the frequency of the reference frequency input signal 212 (designated herein as $2F_{REF}$). Prior to describing the operation of amplitude controlling circuit 230, a mathematical derivation of how $2F_{REF}$ can be used to control the amplitude of the reference frequency input signal will be provided.

Specifically, assume the phase detector 208 is driven by two input signals $s_1(t)$ and $s_2(t)$, corresponding respectively to the reference frequency input signal 212 and the output signal 206 (or the signal 206' the frequency of which is optionally offset by the frequency of an offset frequency signal 218), where:

$$s_1(t) = A_1 \sin[\omega t + \phi_1(t)] \quad (1)$$

$$s_2(t) = A_2 \cos[\omega t + \omega_2(t)] \quad (2)$$

The error signal 214 that is the output of the sinusoidal phase detector 208, also referred to as a multiplier, may be represented as $$P(t) = [s_1(t)^* s_2(t)] = \frac{K}{2} A_1 A_2 \sin[\varphi_1(t) - \varphi_2(t)] + \frac{K}{2} A_1 A_2 \sin[2\omega t + \varphi_1(t) + \varphi(t)] \quad (3)$$

where K is the phase detector gain constant. As shown by Equation 3, in addition to the low frequency component that is proportional to the amplitudes of the input signals and that carries the information about the phase difference between them, there is also a component at $2F_{REF}$ that is proportional to the amplitudes of the two signals. This component at twice the frequency of the reference frequency input signal is used to sense the effective gain of the phase detector 208 and to control the amplitude of the reference frequency input signal and consequently to control the gain of the phase detector.

Figure 4:
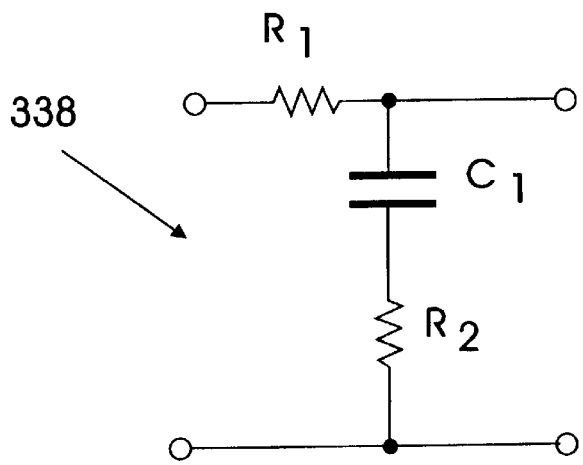
FIG. 4 is a circuit diagram of a loop filter of FIG. 3.

Referring again to FIG. 3, the amplitude control circuit 230 includes a bandpass filter 332 that is responsive to the error signal 214 to produce a filtered error signal 342. As already described, the bandpass filter 232 is centered at about twice the frequency of the reference frequency input signal. An optional amplifier 334 may be provided as needed to produce an amplified filter error signal 344. An envelope detector 336 is responsive to the filtered error signal 342 (optionally via amplifier 334), to detect the amplitude thereof. For example, the envelope detector 336 can be a rectifier that rectifies the filtered error signal to provide a signal that is proportional to the amplitude thereof. The amplitude control signal 346 that is produced by the envelope detector 336 may be filtered by an amplitude control loop filter 338, designed to provide stability for the feedback loop. It will be understood by those having skill in the art that this amplitude control loop filter 338 generally has a different filter characteristic than the loop filter 216. Loop filter 338 may be a lag-lead type filter as shown in FIG. 4, including a pair of resistors $R_1$ and $R_2$ and a capacitor $C_1$.

Still referring to FIG. 3, the output of amplitude control loop filter 338 provides an attenuation control signal 348 for variable attenuation circuit 340. The variable attenuation circuit 340 is thus responsive to the envelope detector 336, to variably attenuate the phase locked loop input signal 232 based upon the detected amplitude of the filtered error signal 342 and thereby produce constant amplitude reference frequency input signal 212.

Figure 5:
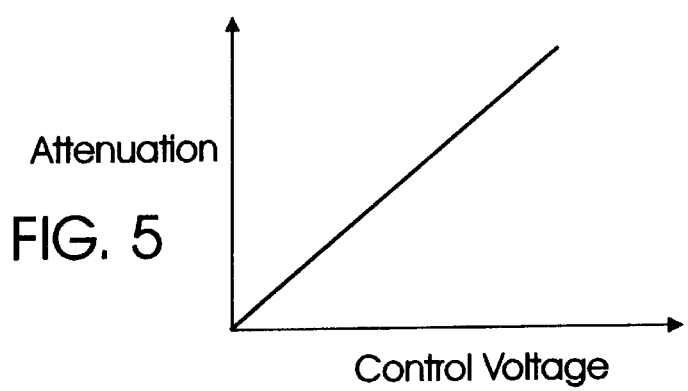
FIG. 5 graphically illustrates the transfer characteristics of a variable attenuator of FIG. 3.

The variable attenuation circuit 340 is preferably a linear variable attenuator that has a transfer function as shown in FIG. 5. However, it will be understood that other attenuators with correct polarity of the slope of the transfer function which is a monotonic function of the attenuation control signal, may also be used since it is part of a feedback loop around phase detector 208.

Figure 6:
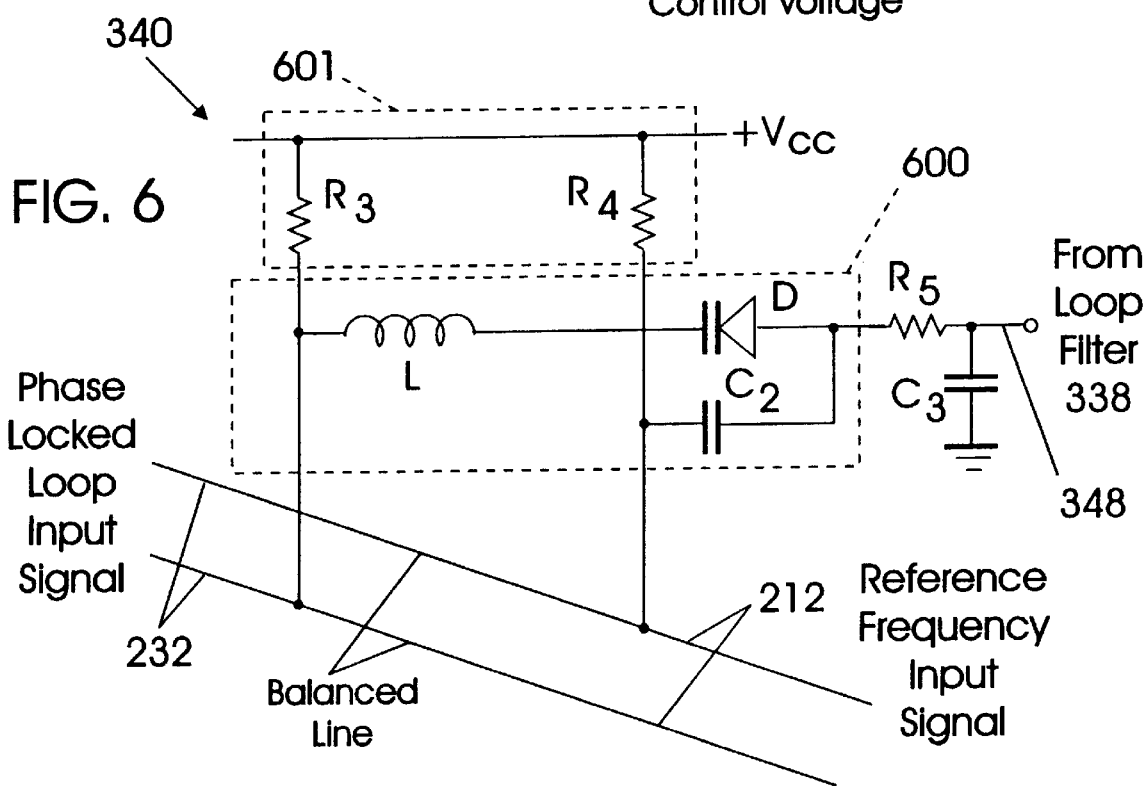
FIG. 6 is a circuit diagram of a variable attenuation circuit of FIG. 3.

FIG. 6 illustrates an embodiment of a variable attenuation circuit 340. It will be understood by those having skill in the art that the variable attenuation circuit may be implemented by a variable resistive attenuator. However, in order to reduce the number of noise sources within the loop, an attenuator built from reactive components is preferred. Accordingly, in a preferred aspect of the present invention, the variable attenuation circuit 340 is implemented using a resonant tank notch circuit 600. The variable attenuation circuit 340 of FIG. 6 may be used with a balanced phase locked loop input signal 232 to generate a balanced reference frequency input signal 212. The balanced signal lines may use a bias circuit 601, which includes, for example, two resistors $R_3$ and $R_4$ between a power supply line Vcc and the balanced lines. The resonant tank notch circuit 600 includes an inductor L, a varactor or variable capacitance diode D and a capacitor $C_2$. The varactor is tuned using the attenuation control signal 348 from amplitude control loop filter 338. Resistor $R_5$ and capacitor $C_3$ are used to decouple the reference frequency input signal 212 from the attenuation control signal 348.

It will be understood that the design of each of the individual blocks of FIG. 3 are well known to those having skill in the art. Thus, although preferred embodiments for the blocks of the amplitude control circuit 230 have been described, there are other conventional designs for each of the blocks of FIG. 3.

As described above, the amplitude control circuit 230 acts as a negative feedback control circuit around phase detector 208. A signal at frequency $2F_{REF}$ appears as a component of the error signal 214 at the output of the phase detector 208. The bandpass filter 332 passes this signal to the amplifier 334, envelope detector 336 and amplitude control loop filter 338. The loop filter produces an attenuation control signal 348 which controls the operating point of a variable attenuation circuit 340. As the attenuation control signal 348 increases, the degree of attenuation increases.

Phase locked loops and operating methods according to the present invention do not require a variable gain amplifier to be placed inside the loop, for example at the phase detector output error signal 214 or at the loop filter output control signal 204. Since an amplifier in the loop may introduce other 1/f noise sources, it may degrade phase locked loop noise performance. Phase locked loop circuits and methods according to the present invention control the level of the signal at a much higher frequency ($2F_{REF}$) than the frequency of the control signal, so that the impact of the 1/f noise sources within the variable attenuation circuit on the phase locked loop noise performance may be reduced. Moreover, by coupling the signal for the amplitude control from the phase detector at a higher frequency, loading of the phase detector output may be reduced. In particular, the bandpass filter input impedance can be very high at low frequencies, so that severe loading of the phase detector can be avoided. Finally, if this impedance has capacitive character, it can also be used to accommodate part of the capacitance from the phase locked loop filter 216.

In the drawings and specification, there have been disclosed typical preferred embodiments of the invention and, although specific terms are employed, they are used in a generic and descriptive sense only and not for purposes of limitation, the scope of the invention being set forth in the following claims.

What is claimed is:

1. A phase locked loop comprising:
   a controlled oscillator that is responsive to a control signal to generate an output signal;
   a phase detector that is responsive to a reference frequency input signal and to the output signal to produce an error signal;
   a loop filter that filters the error signal to thereby produce the control signal;
   a band pass filter that is responsive to the error signal to produce a band pass filtered error signal;
   an envelope detector that is responsive to the band pass filtered error signal to detect the amplitude thereof; and
   a variable attenuation circuit that is responsive to the envelope detector to variably attenuate a phase locked loop input signal based upon the amplitude of the band pass filtered error signal and produce the reference frequency input signal.

2. A phase locked loop according to claim 1 wherein the band pass filter is centered at about twice the reference frequency.

3. A phase locked loop according to claim 1 wherein the variable attenuation circuit is a linear variable attenuator.

4. A phase locked loop according to claim 3 wherein the linear variable attenuation circuit comprises a resonant tank notch circuit.

5. A phase locked loop according to claim 1 further comprising:
   a frequency converter that is responsive to the output signal and to an offset frequency signal, the phase detector being responsive to the frequency of the output signal, offset by the frequency of the offset frequency signal.

6. A phase locked loop comprising:
   means for generating an output signal in response to a control signal;
   means for producing an error signal in response to a reference frequency input signal and to the output signal;
   means for filtering the error signal to thereby produce the control signal;
   means for band pass filtering the error signal to produce a band pass filtered error signal;
   means for sensing the amplitude of the band pass filtered error signal; and means for variably attenuating a phase locked loop input signal to produce the reference frequency input signal in response to the means for sensing the amplitude of the band pass filtered error signal.

7. A phase locked loop according to claim 6 wherein the means for sensing the amplitude comprises means for envelope detecting.

8. A phase locked loop according to claim 6 wherein the means for band pass filtering is centered at about twice the reference frequency.

9. A phase locked loop according to claim 5 wherein the means for variably attenuating comprises means for linearly variably attenuating.

10. A method for controlling a phase locked loop comprising a controlled oscillator that is responsive to a control signal to generate an output signal, a phase detector that is responsive to a reference frequency input signal and to the output signal to produce an error signal and a loop filter that filters the error signal to thereby produce the control signal, the controlling method comprising the steps of:

band pass filtering the error signal to produce a band pass filtered error signal;

sensing the amplitude of the band pass filtered error signal; and variably attenuating a phase locked loop input signal to produce the reference frequency input signal in response to the amplitude of the band pass filtered error signal.

11. A method according to claim 10 wherein the sensing the amplitude step comprises the step of envelope detecting.

12. A method according to claim 10 wherein the band pass filtering step comprises the step of band pass filtering the error signal centered at about twice the reference frequency.

13. A method according to claim 10 wherein the variably attenuating step comprises the step of linearly variably attenuating.

\* \* \* \* \*

UNITED STATES PATENT AND TRADEMARK OFFICE
CERTIFICATE OF CORRECTION

PATENT NO. : 5,945,854
DATED : August 31, 1999
INVENTOR(S) : Bogdan Sadowski

It is certified that error appears in the above-identified patent and that said Letters Patent is hereby corrected as shown below:

Column 4, Line 36, in the equation, please delete "$\omega_2$" and substitute -- $\varphi_2$ -- therefor.
Column 4, Line 44, in the equation, please delete "$\varphi(t)$" and substitute -- $\varphi_2(t)$ -- therefor.
Column 7, Line 11, please delete "5" and substitute -- 6 -- therefor.

Signed and Sealed this

First Day of February, 2000

Attest:

*Attesting Officer*

Q. TODD DICKINSON

*Acting Commissioner of Patents and Trademarks*